(12) United States Patent
Lee et al.

(10) Patent No.: US 10,825,628 B2
(45) Date of Patent: Nov. 3, 2020

(54) ELECTROMAGNETICALLY ACTUATED MICROELECTROMECHANICAL SWITCH

(71) Applicant: Analog Devices Global Unlimited Company, Hamilton (BM)

(72) Inventors: Check F. Lee, Bedford, MA (US); Philip James Brennan, Banson (IE)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/652,181

(22) Filed: Jul. 17, 2017

(65) Prior Publication Data

US 2019/0019644 A1    Jan. 17, 2019

(51) Int. Cl.
| | |
|---|---|
| *H01F 5/00* | (2006.01) |
| *H01H 50/00* | (2006.01) |
| *H01H 1/24* | (2006.01) |
| *B81B 3/00* | (2006.01) |

(Continued)

(52) U.S. Cl.
CPC ......... *H01H 50/005* (2013.01); *B81B 3/0054* (2013.01); *H01H 1/242* (2013.01); *H01H 59/0009* (2013.01); *H01H 1/0036* (2013.01); *H01H 2001/0042* (2013.01); *H01H 2001/0052* (2013.01)

(58) Field of Classification Search
CPC ............................... H01H 51/22; H01H 47/00
USPC ......................................................... 335/299
See application file for complete search history.

(56) References Cited

U.S. PATENT DOCUMENTS

| | | | | |
|---|---|---|---|---|
| 5,322,258 A | * | 6/1994 | Bosch ....................... | F15O 5/00 251/129.01 |
| 5,619,177 A | * | 4/1997 | Johnson ............. | H01H 59/0009 251/129.01 |

(Continued)

FOREIGN PATENT DOCUMENTS

| | | |
|---|---|---|
| CN | 1419702 A | 5/2003 |
| CN | 101154509 A | 4/2008 |

(Continued)

OTHER PUBLICATIONS

Cho et al., A Low-Voltage and Low-Power RF MEMS Series and Shunt Switches Actuated by Combination of Electromagnetic and Electrostatic Forces. IEEE Transactions on Microwave Theory and Technques. Jul. 2005;53(7):2450-2457.

(Continued)

*Primary Examiner* — Shawki S Ismail
*Assistant Examiner* — Lisa N Homza
(74) *Attorney, Agent, or Firm* — Wolf, Greenfield & Sacks, P.C.

(57) ABSTRACT

An microelectromechanical switch uses electrostatic attraction to draw a beam toward a contact and electromagnetic repulsion to disengage and repel the beam from the contact. The electrostatic attraction is generated by a gate electrode. The electromagnetic repulsion is generated between the beam and a magnetic coil positioned on the same side of the beam as the contact. The magnetic coil produces a magnetic field, which induces a current in the beam that repels the magnetic coil. The gate electrode and the magnetic coil may be co-planar or in different planes. A circuit may also operate a coil-shaped structure act as the gate electrode and the magnetic coil, depending on the configuration.

20 Claims, 9 Drawing Sheets

(51) Int. Cl.
*H01H 59/00* (2006.01)
*H01H 1/00* (2006.01)

(56) References Cited

U.S. PATENT DOCUMENTS

| | | | | |
|---|---|---|---|---|
| 5,666,258 | A * | 9/1997 | Gevatter | H01H 57/00 361/207 |
| 5,945,898 | A * | 8/1999 | Judy | G02B 26/0841 257/415 |
| 6,124,650 | A * | 9/2000 | Bishop | H01H 50/005 310/40 MM |
| 6,379,623 | B1 * | 4/2002 | Mays, Jr. | G01N 21/66 422/82.08 |
| 6,457,360 | B1 * | 10/2002 | Daraktchiev | B81B 3/0018 73/504.15 |
| 6,479,920 | B1 * | 11/2002 | Lal | G21H 1/00 310/309 |
| 6,496,612 | B1 * | 12/2002 | Ruan | G02B 6/358 385/18 |
| 6,629,461 | B2 * | 10/2003 | Behin | G02B 6/357 310/309 |
| 6,794,965 | B2 * | 9/2004 | Shen | G02B 26/08 200/181 |
| 6,897,539 | B2 * | 5/2005 | Behin | G02B 6/3566 257/434 |
| 6,924,966 | B2 | 8/2005 | Prophet | |
| 7,101,724 | B2 | 9/2006 | Chou | |
| 8,174,342 | B2 | 5/2012 | Min et al. | |
| 8,446,237 | B1 | 5/2013 | Lee et al. | |
| 9,583,294 | B2 | 2/2017 | Lee et al. | |
| 2002/0021860 | A1 | 2/2002 | Ruan et al. | |
| 2005/0047010 | A1 | 3/2005 | Ishiwata et al. | |
| 2006/0274470 | A1 | 12/2006 | Srinivasan et al. | |
| 2014/0145804 | A1 | 5/2014 | Pagani | |
| 2016/0020051 | A1 * | 1/2016 | Ma | H01H 59/0009 343/750 |
| 2017/0066645 | A1 | 3/2017 | Brewer et al. | |

FOREIGN PATENT DOCUMENTS

| | | |
|---|---|---|
| CN | 101158748 A | 4/2008 |
| CN | 101501805 A | 8/2009 |
| CN | 102142336 A | 8/2011 |
| CN | 102730620 A | 10/2012 |
| CN | 106573770 A | 4/2017 |
| EP | 1723909 A1 | 11/2006 |
| JP | 2003-057572 A2 | 2/2003 |
| JP | 2003-522377 A | 7/2003 |
| JP | 2007-250434 A | 9/2007 |
| JP | 2008-016452 A | 1/2008 |
| WO | WO 01/57899 A1 | 8/2001 |

OTHER PUBLICATIONS

Wright et al. A large-force, fully integrated MEMS magnetic actuator. Solid State Sensors and Actuators. 1997 International Conference on Transducers. 1997.

Zhang et al., Low-stress permalloy for magnetic MEMS switches. IEEE Transactions on Magnetics. Jan. 2006;42(1):51-55.

Li et al., High Efficiency Coupling with Stacked MEMS Coils. Proceedings of the 2010 5$^{th}$ IEEE International Conference on Nano/Micro Engineered and Molecular Systems. Jan. 20-23, 2010; 509-512.

* cited by examiner

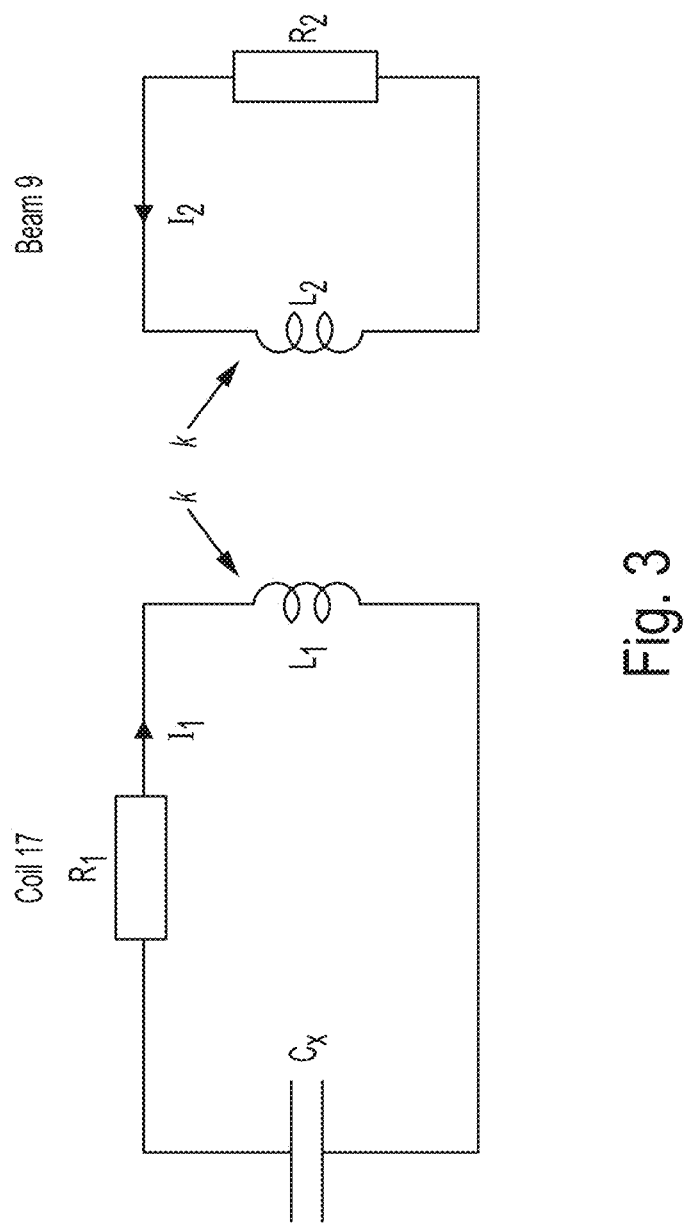

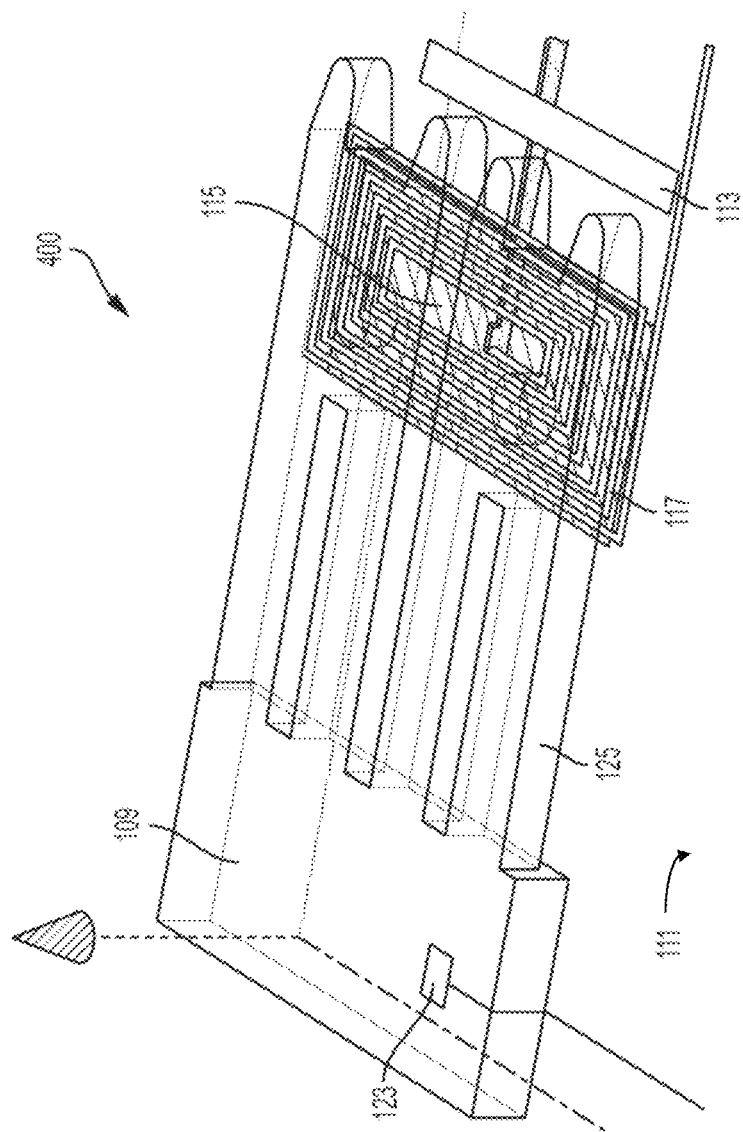

US 10,825,628 B2

ELECTROMAGNETICALLY ACTUATED MICROELECTROMECHANICAL SWITCH

FIELD

Disclosed embodiments are related to switches for microelectromechanical systems (MEMS).

BACKGROUND

Switches are used to make or break connections in electrical circuits. A typical MEMS switch comprises a cantilevered beam coupled to a signal source. The free end of the beam is actuated to open and close the switch. When the switch is closed, the signal from the signal source passes through the beam, and when the switch is opened the signal path is broken. Typically the switch has a default open state, when no force is applied to the cantilevered beam. An electrostatic force is applied to close the switch.

SUMMARY

An microelectromechanical switch uses electrostatic attraction to draw a beam toward a contact and electromagnetic repulsion to disengage and repel the beam from the contact. The electrostatic attraction is generated by a gate electrode. The electromagnetic repulsion is generated between the beam and a magnetic coil positioned on the same side of the beam as the contact. The magnetic coil produces a magnetic field, which induces a current in the beam that repels the magnetic coil. The gate electrode and the magnetic coil may be co-planar or in different planes. A circuit may also operate a coil-shaped structure act as the gate electrode and the magnetic coil, depending on the configuration.

In one embodiment, a MEMS switch is provided, comprising a beam, a gate electrode underlying the beam, and a coil underlying the beam and configured to induce a current in the beam.

In another embodiment, a MEMS switch comprises a beam and a coil underlying the beam, wherein the coil is configured to induce a current in the beam.

In another embodiment, a method of controlling a MEMS switch is provided. The method includes electrostatically attracting a microfabricated, cantilevered beam toward an underlying electrical contact using a gate electrode underlying the microfabricated, cantilevered beam. The microfabricated, cantilevered beam is magnetically repulsed from the underlying electrical contact by inducing a current in the beam by generating a first magnetic field with a coil positioned under the beam.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 3 is a schematic circuit representation of the coil and beam of the MEMS switch of FIG. 1A.

FIG. 4A is a top left side perspective view of a MEMS switch in which a coil is positioned above a gate electrode according to another embodiment;

DETAILED DESCRIPTION

Figure 1A:
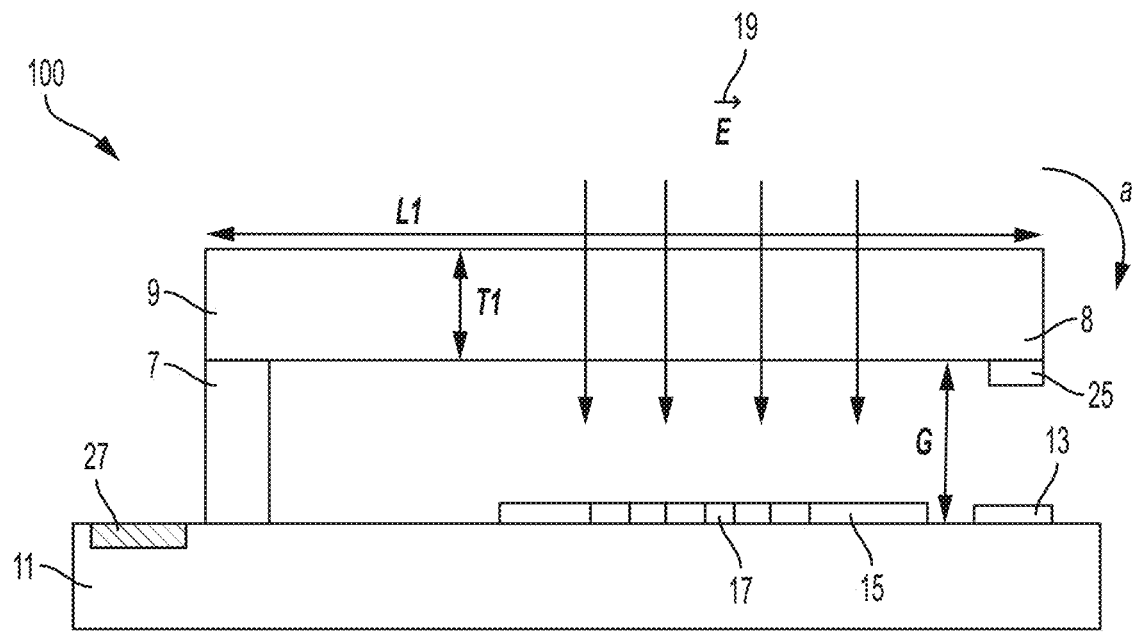
FIG. 1A is a left side elevation view of a microelectromechanical systems (MEMS) switch in an open state, according to one embodiment.

Aspects of the present application provide microelectromechanical systems (MEMS) switches which are actuated at least in part using an electromagnetic force. For example, the switch may be opened using an electromagnetic force, irrespective of the manner in which the switch is closed. The inventors have recognized that MEMS switches having a cantilevered beam actuated solely with an electrostatic force—closing the switch through application of the electrostatic force and opening the switch by removing the electrostatic force—can suffer various drawbacks. For one, despite removing the electrostatic force in an attempt to open the switch, the free end of the beam may remain in contact with the underlying electrical contact due to stiction, such that the switch remains in a closed state. Moreover, cantilevered beams can soften when held in a bent position for extended periods of time. MEMS switches which are opened by removal of an electrostatic force rely on the restorative spring-like behavior of the cantilevered beam to return the beam to a non-deformed state, thus opening the switch. Softening of the beam material as a result of holding the switch in a closed, deformed (or bent) state for extended periods of time may negatively impact the ability of the beam to return to its un-bent state, a phenomena sometimes referred to as creep force. Thus, the switch may not properly open.

In view of the above, aspects of the present application provide MEMS switches which are operated using electromagnetic force to selectively repel a cantilevered beam away from the contact pad. By placing an electromagnetic coil under the beam, an electromagnetic force can be generated and used to selectively actuate a beam, even if it is stuck to the contact or the beam has deformed. This ensures that a switch can be turned off after being in a closed state for an extended period of time.

The use of an electromagnetic force to actuate a MEMS switch can be combined with other actuation techniques. For example, electrostatic techniques may be combined with the electromagnetic techniques. As one example, a MEMS switch may be closed and held in a closed state using an electrostatic force, and may then be opened by removing the electrostatic force and applying a repulsive electromagnetic force. Thus, the activation and deactivation of the switch may be achieved through separate (or "different") mechanisms. Other operating scenarios are also possible.

Aspects of the present application provide a MEMS switch having an actuation structure underlying the free end of a cantilevered micromachined beam, with the actuation structure being shaped as a coil and operable as both an electromagnetic coil and an electrical plate. The coil structure may be coupled to an electrical circuit which, when configured in one state, operates the coil as an electromagnetic coil to generate an electromagnetic force. When configured in another state, the electrical circuit may operate the coil as a conductive plate, to generate an electrostatic force. Thus, a combined electromagnetic/electrostatic actuation structure may be provided in a MEMS switch according to some aspects of the present application.

It should be appreciated that although some embodiments are described herein as relating to cantilevered beam MEMS switches, the disclosure is not so limited and various other MEMS switch configurations may utilize one or more of the aspects described herein, such as the use of electromagnetic repulsion to selectively actuate the MEMS switch. Thus, cantilevered beam, teeter-totter type, or other MEMS switches may be employed.

FIG. 1A shows a non-limiting example of a cantilevered beam MEMS switch having an electromagnetic coil for generating a repulsive force to open the switch. The MEMS switch 100 is shown in an open state in FIG. 1A. The open state of operation may represent an "OFF" state of the switch, although it should be appreciated that this terminology is not limiting.

The MEMS switch 100 includes a cantilevered beam 9 that is mounted to a substrate 11 by an anchor 7. The cantilevered beam 9 has a free end 8 separated from the underlying substrate by a gap G. An electrical contact 25 is disposed at the free end 8 of the cantilevered beam 9, on an underside of the beam facing the substrate 11. An electrical contact 13, a gate electrode 15, and a coil 17 are mounted on (or fabricated on) the substrate 11, below the beam 9. A radio frequency (RF) signal source 27 is also provided, and may be coupled to the cantilevered beam 9 in any suitable manner to provide an RF signal to the beam, as described further below.

The substrate 11 may be formed of any suitable material. In some embodiments, the substrate 11 is formed from an insulating material like glass, plastic, or a polymer. In some embodiments, the substrate 11 may be a semiconductor substrate, such as a silicon substrate or silicon on insulator (SOI) substrate.

The cantilevered beam 9 may be formed of any suitable material. In one embodiment, the beam 9 is formed of a conductive material, such as a metal or metal alloy. Thus, the beam 9 itself may represent an electrode in at least some embodiments, capable of conducting the RF signal from the RF signal source 27. In another embodiment, the beam 9 is formed of an insulating material, such as a plastic or polymer material, and has an electrode mounted to it or formed therein. Any such electrode may allow for electrostatic and/or electromagnetic actuation of the beam when the beam material itself is not conductive. As has been described previously, the cantilevered beam may act as a spring. The material of the beam 9 may be selected in part to provide desired spring-like behavior. For example, the beam 9 may have a spring constant between 200-6000 N/m.

The cantilevered beam 9 may have any suitable shape and dimensions. In some embodiments, the cantilevered beam 9 has a uniform thickness T1 along its length L1. In other embodiments, the cantilevered beam 9 may taper at one end. In one embodiment, the beam 9 has a length L1 that is greater than its width (in a direction into and out of the page in FIG. 1A). For example, the dimensions of the beam may be such that the length L1 is between 100-700 µm, the width is between 50-500 µm, and the thickness T1 is between 1-15 µm, although other ranges for any of these dimensions are possible.

The gap G may have any suitable dimensions. It should be appreciated that the gap is variable, since it exists when the switch is open, but not when the switch is closed. When the cantilevered beam is in a neutral (non-deflected) state, the gap G may be 0.5 µm, 5 µm, 50 µm, 100 µm, 200 µm, any value between 0.5 µm and 200 microns, or another appropriate distance.

While FIG. 1A illustrates an example of a MEMS switch having a single cantilevered beam 9, alternative embodiments include multiple beams, or "fingers." An example is described further below in connection with FIGS. 4A-4B. The number of beams employed is not limiting, as various aspects of the present application may apply to MEMS switches having one or more beams.

The anchor 7 may be formed of any suitable material. In some embodiments, the anchor 7 comprises the same material as the substrate 11. In other embodiments, the anchor 7 comprises the same material as the cantilevered beam 9. In still other embodiments, the anchor 7, cantilevered beam 9, and substrate 11 may be formed of separate materials, suitably coupled through micromachining techniques or other mechanisms.

The electrical contact 25 may be formed of a conductive material, such as a metal or a metal alloy. In one embodiment, the contact 25 is a gold-chromium alloy. In one embodiment, the contact 25 protrudes from the surface of the beam 9 (e.g., as a layer of material formed on a surface of the beam 9), while in other embodiments, the contact 25 is flush with the surface of the beam 9. In those embodiments in which the MEMS switch includes multiple beams, or fingers, multiple electrical contacts 25 may be provided. For example, one or more of the beams may include an electrical contact.

The gate electrode 15 and coil 17 (which may be referred to herein alternatively as a "spiral") are conductive and may be formed of any suitable conductive materials. For example the gate electrode 15 and coil 17 may be formed of metal, metal alloys, or other conductive materials. Suitable examples include aluminum, copper, ruthenium, polysilicon or other materials commonly used for metal-oxide semiconductor (MOS) processing. In some embodiments, materials having conductivity greater than 10,000 S/m are used. In some embodiments, the gate electrode 15 and coil 17 may be formed of the same material, for example being formed from a common metal layer on the substrate 11. As will be described further below, the coil 17 may be used to generate an electromagnetic field by applying a current thereto. Thus, the material of the coil 17 may be selected to provide desired time constant behavior. For example, in some embodiments the coil 17 may be selected to have a time constant in the range of 0.5 ns-5 µs, including any value within that range.

The gate electrode 15 and coil 17 may have any suitable configuration with respect to each other. In the non-limiting example of FIG. 1A, the gate electrode 15 and coil 17 are distinct electrical structures. In alternative embodiments, such as that shown in FIG. 6, an actuation structure representing a combined gate electrode and coil may be employed. In the embodiment of FIG. 1A, the gate electrode 15 and the coil 17 are co-planar, although alternatives are possible, such as those described below in connection with FIGS. 5B-5C. In one embodiment, the coil 17 surrounds the gate electrode 15. Alternatively, the coil 17 and the gate electrode 15 may be side-by-side. In some embodiments, the coil 17 and/or the gate electrode 15 may be segmented, and the various segments may be arranged relative to each other in any suitable way. An example is described further below in connection with FIG. 4B.

The gate electrode 15 and coil 17 may be driven by, or connected to, respective sources or supplies. For example, a first voltage supply may be connected to the gate electrode 15 and a second voltage supply to the coil 17. The supplies may be on-chip or off-chip.

The contact 13 may be a conductive line mounted on the substrate 11. In one embodiment, the conductive line is a microwave transmission line, which may be broken unless the contact point 25 connects the broken portions to complete the circuit. In one embodiment, the contact 13 is the same material as the contact 25, although different materials may be used.

The RF signal source 27 may be any suitable signal source, and may be located at any suitable position to provide an RF signal to the beam 9. In some embodiments, the RF signal source may be located on the substrate 11, although in other embodiments the signal source may be located off-chip. The RF signal source may be connected to the anchor 7 to provide the RF signal to the beam 9 when the anchor 7 is formed of a conductive material, or a separate electrical path (e.g., an electrical trace) may be provided to the beam 9.

The MEMS switch 100 may be a microfabricated structure, with the components formed on the substrate 11 using microfabrication techniques. For example, the components of the MEMS switch 100 may be fabricated using at least one of deposition, etching, lithography, or other suitable techniques.

Figure 1B:
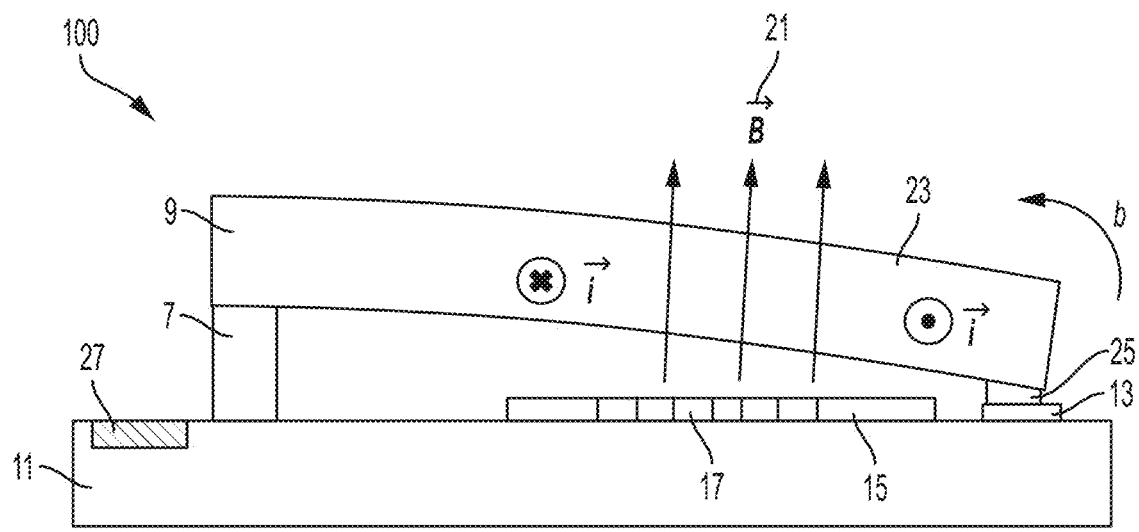
FIG. 1B is a left side elevation view of the MEMS switch of FIG. 1A in a closed state.

FIG. 1A shows the MEMS switch in an open state, when the cantilevered beam 9 is in a neutral position. FIG. 1B illustrates the MEMS switch in a closed state. The closed state of operation may represent an "ON" state of the switch, although it should be appreciated that this terminology is not limiting. In this state, the cantilevered beam 9 is deflected (or "deformed," or "bent") toward the substrate 11 such that the contacts 13 and 25 touch.

Figure 2:
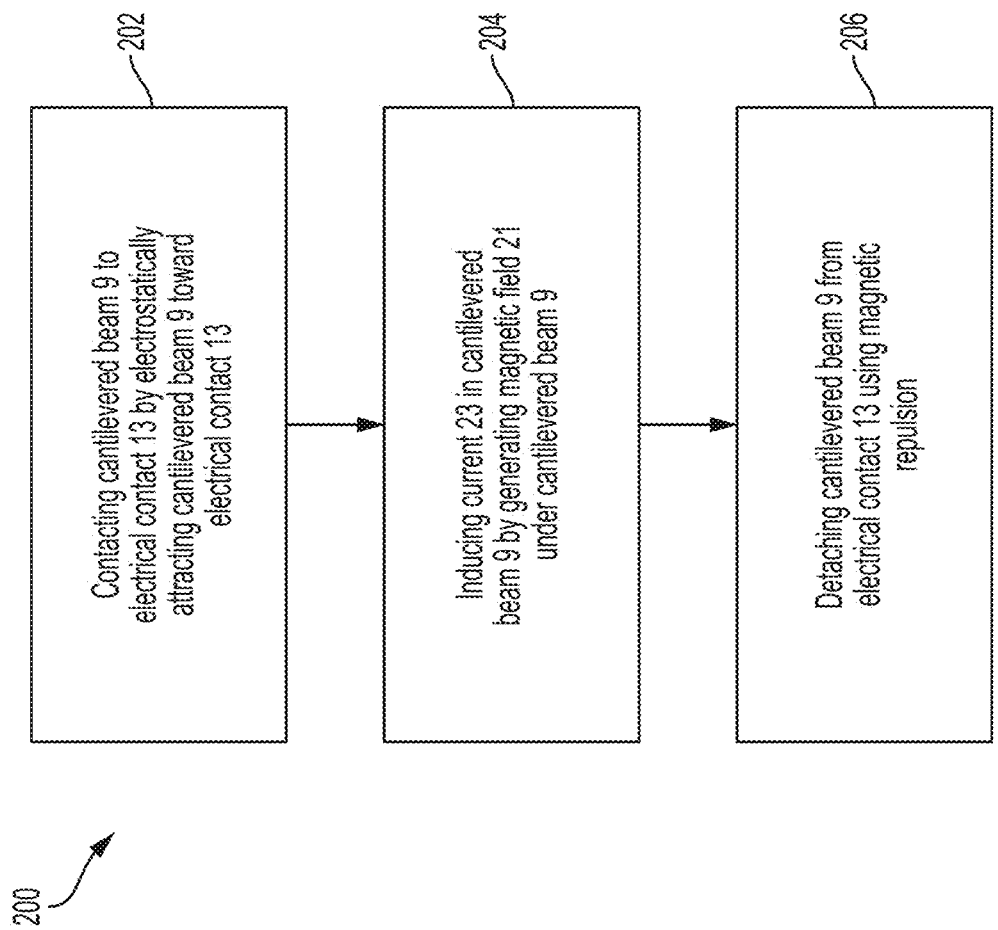
FIG. 2 is an operational flowchart of the MEMS switch of FIG. 1A, according to a non-limiting embodiment.

The operation of the MEMS switch 100 is described in connection with FIG. 2, and may include a combination of electrostatic and electromagnetic actuation. In general, the operation may involve closing the switch 100 by deflecting the beam 9 toward the substrate 11 using an electrostatic force generated with the gate electrode 15, and holding the switch closed by continued application of the electrostatic force. The switch 100 may be opened by turning off the electrostatic force, and applying a repulsive electromagnetic force using the coil 17. Further detail is described below.

Again, FIG. 1A illustrates the switch 100 in an open state. Referring to FIG. 2, a method 200 of operating the switch 100 may comprise, at stage 202, closing the switch 100 by contacting cantilevered beam 9 to electrical contact 13 by electrostatically attracting the cantilevered beam 9 toward electrical contact 13. A voltage is applied to the gate electrode 15 to electrostatically attract the beam 9 toward the underlying contact 13. The voltage source coupled to the gate electrode 15 may be located on the substrate 11 or off-chip, and may be selectively controlled, either manually or automatically. By applying a voltage to the gate electrode 15, the gate electrode 15 may generate an electric field E as shown in FIG. 1A that results in electrostatic attraction between the beam 9 and the gate electrode 15. The electric field results in a force being applied to the beam 9, causing the beam 9 to pivot in the direction a about the end fixed to the anchor 7. A suitable voltage may be applied to the gate electrode 15 to generate a sufficient electrostatic force to bring electrical contact 25 into contact with electrical contact 13, thus completing the circuit. The resulting closed state is illustrated in FIG. 1B.

Once closed, the switch 100 may be held closed through continued application of an electrostatic force from the gate electrode 15. When closed, the RF signal from the RF signal source may pass through the beam 9 to the electrical contact 13. The switch may be held closed for as long as is desired.

The switch 100 may be opened using a repulsive electromagnetic force generated by the coil 17, consistent with stage 204 of the method 200. That is, at stage 204 the voltage applied to the gate electrode 15 may be turned off, thus ending application of the electrostatic force, and a current may be applied to the coil 17 using a suitable current source, located on the substrate 11 or off-chip. Applying a current to the coil 17 will generate a magnetic field B 21, thus inducing a current i 23 in cantilevered beam 9. For example, a counterclockwise current may be applied to the coil 17, generating a magnetic field 21 pointing toward the beam 9, and thus inducing a clockwise current 23 in the beam 9 according to Lenz's law. The magnetic field associated with the induced current 23 may repel the free end of the beam 9 from the electrical contact 13 at stage 206 of method 200 according to the direction of rotation b shown in FIG. 1B, thus detaching the beam 9 from the electrical contact 13 and thereby opening the switch.

The current applied to the coil 17 may have any suitable magnitude and duration. For example, the current applied may have a magnitude sufficient to generate a sufficient repulsive force to overcome stiction of the beam 9 to the electrical contact 13. For example, the transient current to the coil induces current in the conductive beam which in turn generates 100-1000 µN repulsive force between the beam and the coil. The current may be applied to the coil 17 only temporarily, long enough to detach the beam 9 from the electrical contact 13. Once detached, the restorative force of the beam 9 itself may maintain the switch in the open state, such that an electromagnetic force need not be applied further. In this sense, the electromagnetic force may be applied as an impulse to "kick" the beam 9 back to its neutral position.

The stages of the method 200 may be repeated as often as desired. In some embodiments, the switch may be closed and opened repeatedly in a short duration. In other embodiments, the switch may be maintained in a closed state for an extended duration (e.g., minutes, hours, day, months, or even years), and opened infrequently. Other manners of operation are possible.

FIG. 3 shows a schematic circuit representation of the MEMS switch 100 according to one embodiment. The magnetic coil 17 can be modeled as a circuit with a capacitor $C_x$ in series with a resistor $R_1$ and an inductor $L_1$. The electrode of the cantilevered beam 9 may be modeled as a circuit comprising a resistor $R_2$ and an inductor $L_2$. In one embodiment, $L_1$ and $L_2$ may have the same or different inductances. In another embodiment, $L_1$ and $L_2$ may have the same or different number of turns. When the capacitor $C_x$ is charged, it may discharge and generate a current $I_1$ that passes through the inductor $L_1$ to produce a magnetic field. The magnetic field causes inductor $L_1$ to couple to the inductor $L_2$ with a coefficient of coupling k, generating a current $I_2$ that opposes the change in magnetic field according to Lenz's law. As described previously in connection with FIGS. 1A-1B and 2, the induced current (e.g., current $I_2$) generates a magnetic field which repels the beam 9 from the coil 17.

FIG. 4A shows a MEMS switch 400 according to one embodiment of the present application. The MEMS switch 400 includes a substrate 111, a cantilevered beam 109, an electrical contact 113, a gate electrode 115, and a coil 117. A contact 123 may be positioned on the beam 109 and carry an RF signal. Those components may be formed of any of the materials described previously with respect to the corresponding components of FIG. 1A.

In the example of FIG. 4A, the beam 109 comprises multiple fingers 125. The fingers 125 may all have the same length or may have different lengths. In the embodiment shown, the beam 109 comprises two fingers 125. Each finger 125 may have an electrode mounted to it. However, alternative constructions are possible. For example, in some embodiments one, but less than all, of the fingers of a cantilevered beam have an associated electrical contact.

FIG. 4A illustrates a non-limiting example of a relative configuration of a gate electrode and separate coil of a MEMS switch. In this example, the coil 117 overlies the gate electrode 115, with both being formed on the substrate 111 beneath the free end of the cantilevered beam 109. In this example, the coil 117 comprises a single layer of multiple turns, and occupies substantially the same surface area (or footprint) on the substrate 111 as does the gate electrode 115. However, alternatives are possible, such as the gate electrode occupying a greater surface area than the coil, or vice versa. While the illustrated embodiment has the coil 117 disposed above the gate electrode 115, the alternative configuration is also possible, with the gate electrode between the coil 117 and the cantilevered beam 109.

In one embodiment, the gate electrode 115 and magnetic coil 117 are formed from the same conductive material, such as copper, silver, or a conductive alloy. In another embodiment, the gate electrode 115 and magnetic coil 117 are formed from different materials.

The MEMS switch 400 may operate in the manner previously described in connection with FIG. 2. That is, the switch 400 may be closed by applying an electrostatic force to the cantilevered beam 109 using the gate electrode 115, and may be opened by turning off the electrostatic force and applying a repulsive electromagnetic force using the coil 117.

Figure 4B:
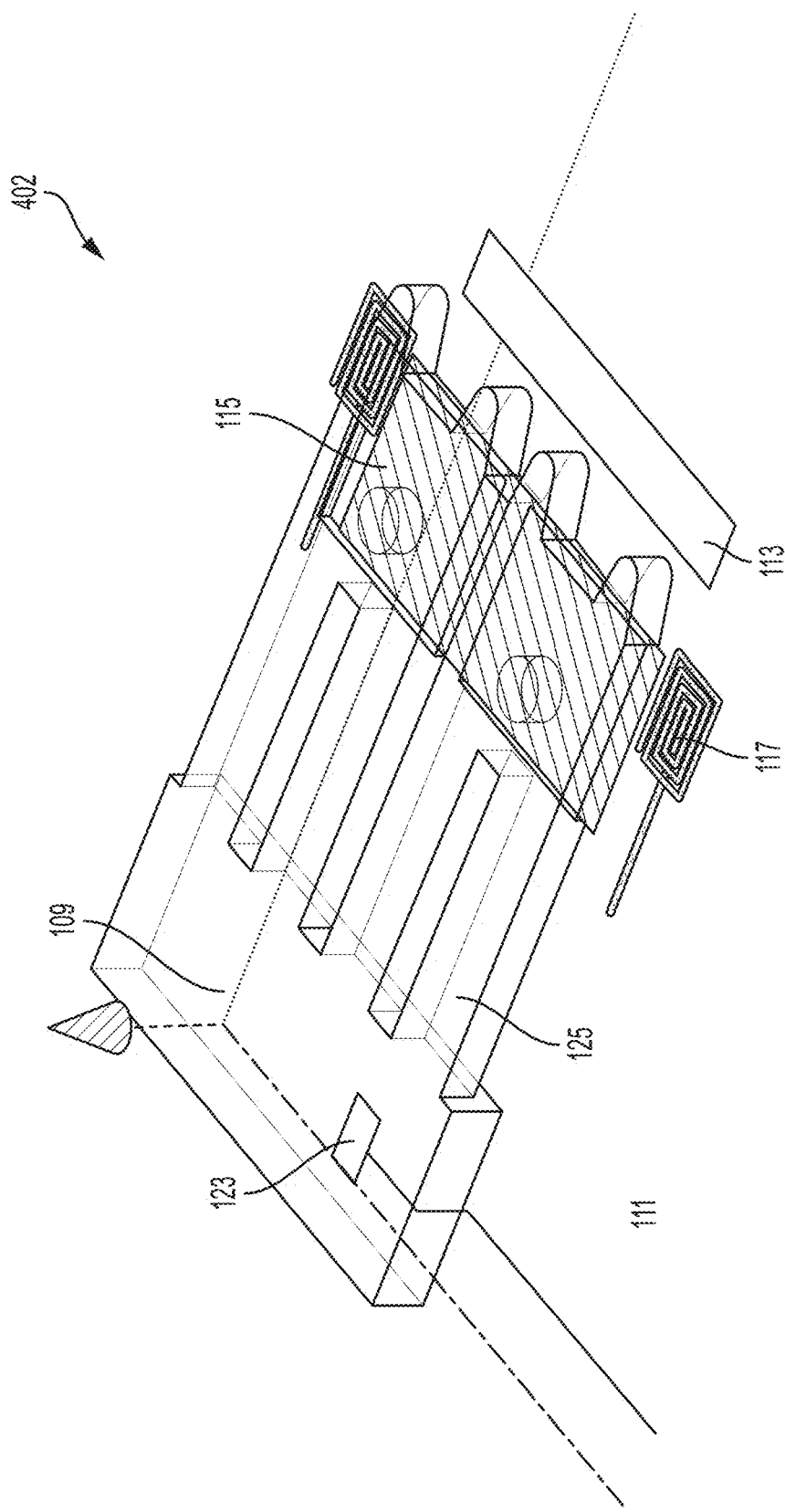
FIG. 4B is a top left side perspective view of a MEMS switch in which multiple coils are positioned adjacent to a gate electrode according to a another embodiment.

FIG. 4B shows an alternative to the MEMS switch of FIG. 4A. In FIG. 4B, the MEMS switch 402 has two coils 117 arranged on either side of the gate electrode 115. That is, the gate electrode is positioned between the two coils 117. In one embodiment, the one or more coils 117 are on either side of the gate electrode 115, which is aligned with the middle of the beam 109. In another embodiment, the one or more coils 117 are on a single side of the gate electrode 115. Although FIG. 4B illustrates two separate coils 117, it should be appreciated that in some embodiments the two illustrated coils may represent portions of a single coil. Thus, aspects of the present application provide MEMS switches having coils with two or more portions positioned to generate a repulsive force for opening a MEMS switch.

Further alternative configurations of gate electrodes and coils are possible, beyond those illustrated in FIGS. 4A-4B. For example, while FIG. 4B illustrates a gate electrode disposed between coils, an alternative configuration has a coil with multiple portions disposed on the same side of a gate electrode. Another alternative configuration has multiple gate electrodes 115. For example, multiple gate electrodes may be disposed on opposite sides of a coil. In embodiments with multiple gate electrodes 115 or magnetic coils 117, a single voltage source may be used to power the gate electrodes 115 or the magnetic coils 117. In another embodiment, multiple voltage sources may be used to power the gate electrodes 115 or the magnetic coils 117, and the voltage sources may be controlled using a timing system.

Figure 5A:
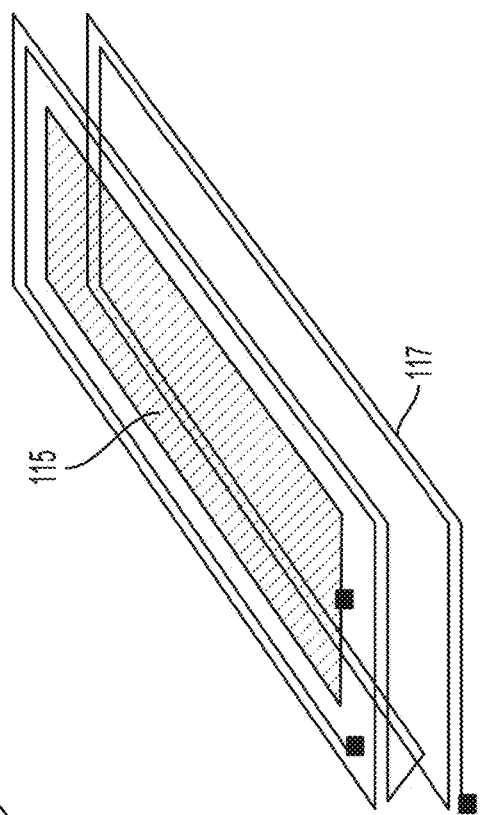
FIGS. 5A-5C illustrate alternative configurations of the coil and gate of a MEMS switch, according to alternative non-limiting embodiments of the present application.
Figure 5B:
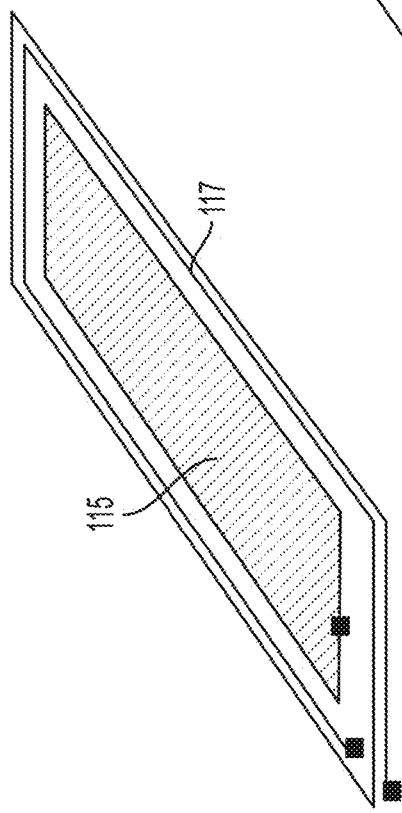
Figure 5C:
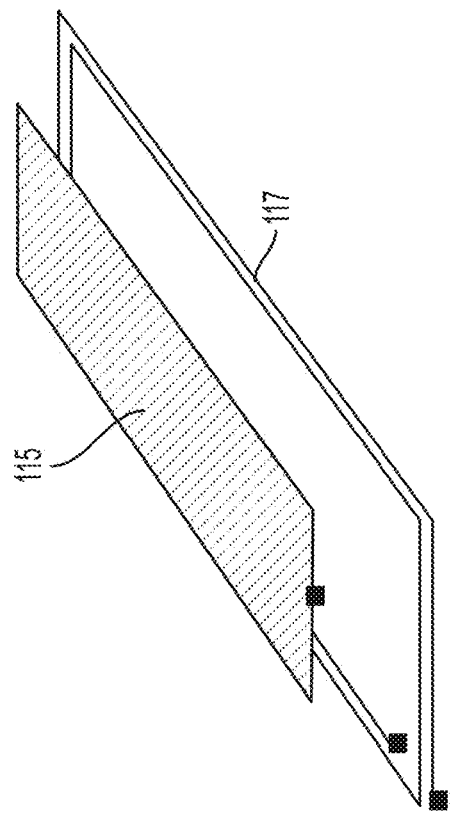

As has been described, various configurations are possible for positioning a gate electrode relative to a coil of a MEMS switch. FIGS. 5A-5C illustrates various non-limiting examples.

FIG. 5A illustrates an example of a gate electrode 115 in-plane (or "coplanar") with the coil 117. In one embodiment, the magnetic coil 117 surrounds the gate electrode 115. In another embodiment, the gate electrode 115 may surround the magnetic coil 117.

FIG. 5B illustrates a non-limiting example in which the coil 117 may have one or more layers. Using a multi-layered approach as shown may allow for achieving a longer coil length than could be obtained with a single-layer structure having the same footprint. For example, the length of the coil 117 shown in FIG. 5B may be between 0.5-10 mm. Each of the one or more layers may have the same number of turns or varying number of turns. When the coil is a multi-layered structure, the coil 117 may have one layer coplanar with the gate electrode 115 as well as one layer either above or below the gate electrode 115.

FIG. 5C illustrates a non-limiting example in which the coil 117 comprises one or more turns positioned below the gate electrode 115. In another embodiment, the magnetic coil 117 is positioned above the gate electrode 115.

In any of the examples of FIGS. 5A-5C, the layers of the coil 117 may comprise turns shaped as ovals, rectangles, or any other shape. In one embodiment, the coil 117 is composed of wire that has a thickness between 0.1-2 µm.

Figure 6:
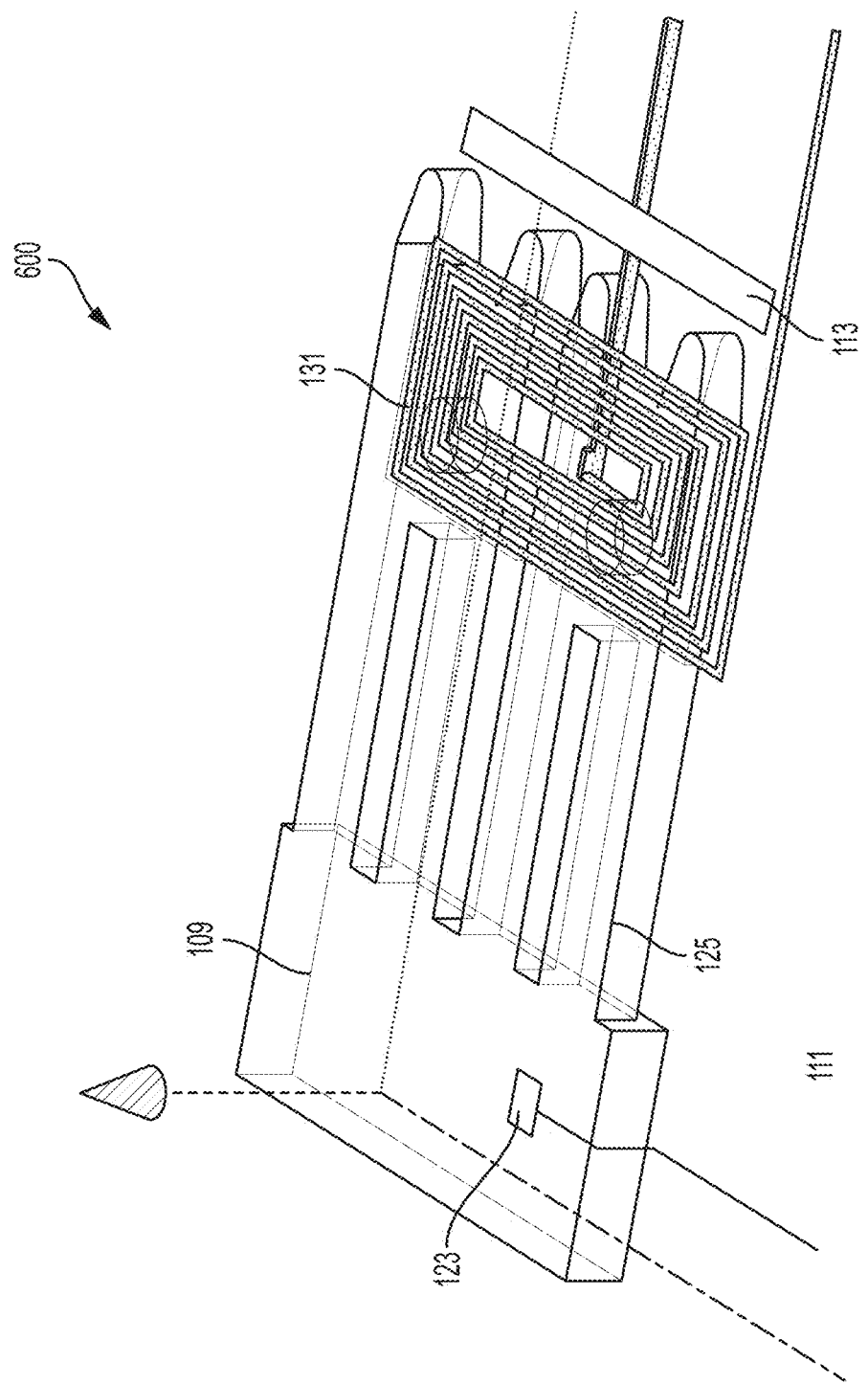
FIG. 6 is a top left side perspective view of a MEMS switch according to another embodiment.

As described above, according to an aspect of the present application, a MEMS switch is provided having an actuation structure or component which operates as a combined gate electrode and coil. FIG. 6 illustrates a non-limiting example. The MEMS switch 600 includes many of the same components of MEMS switch 400, described previously. Thus, those components are not described in detail again here. However, the MEMS switch 600 differs in that it has an actuation component 131 operable as a combined gate electrode and coil. The actuation component 131 may be operated for some period of time as a gate electrode, to generate an electrostatic force (e.g., to close the switch 600 by attracting the cantilevered beam 109), and for a different period of time as a coil to generate an electromagnetic force (e.g., to open the switch 600 by repelling the cantilevered beam 109). As shown, the actuation component 131 may be shaped as a coil. It may be electrically couplable to a circuit in suitable ways to obtain the two different modes of operation, as described below in connection with FIG. 7.

Figure 7:
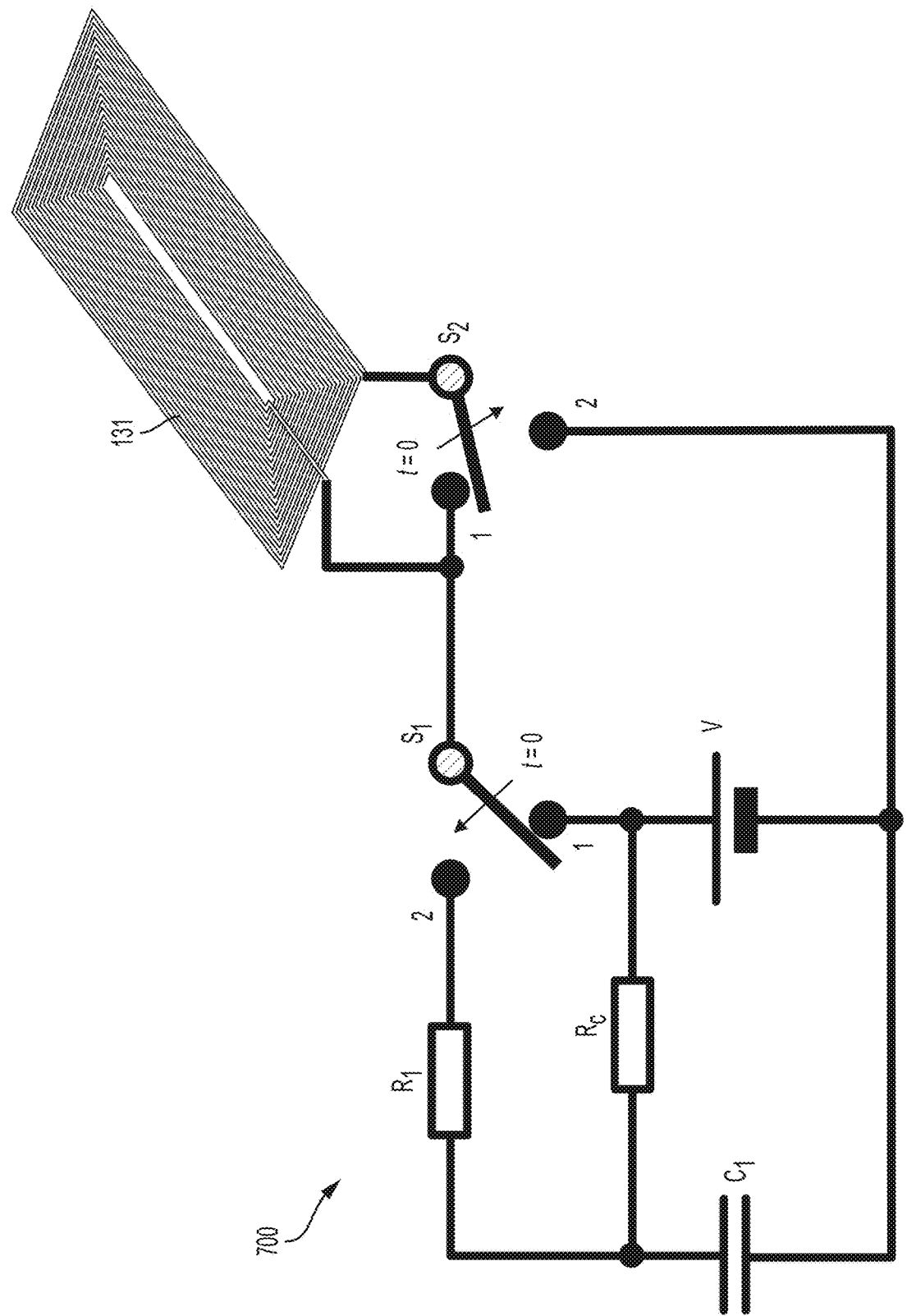
FIG. 7 is a schematic circuit diagram of the coil and gate configuration of the MEMS switch of FIG. 6.

FIG. 7 shows a schematic of a circuit 700 comprising the actuation component 131 and suitable to operate the actuation component 131 as both a gate electrode and a coil. In this non-limiting example, the circuit 700 comprises a resistor $R_C$, a capacitor $C_1$, a charge pump V, a switch $S_1$ that has a first and second position (denoted by 1 and 2 in the figure), and a switch $S_2$ that has a first and second position (denoted by 1 and 2 in the figure). In one embodiment, the circuit may have switches $S_1$ and $S_2$ in the first positions in an initial state (t=0), and the switches may be switched to their respective second positions in a different state. The operation of the circuit 700 may be understood from FIGS. 8A and 8B, which illustrate the circuit representations corresponding to the two states (or modes) of operation.

Figure 8B:
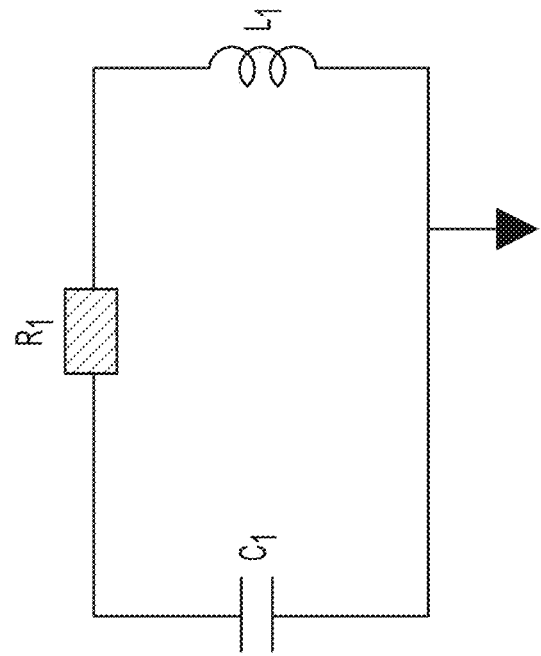
FIG. 8B is a schematic of the coil and gate configuration of the MEMS switch of FIG. 6 at time t>0.
Figure 8A:
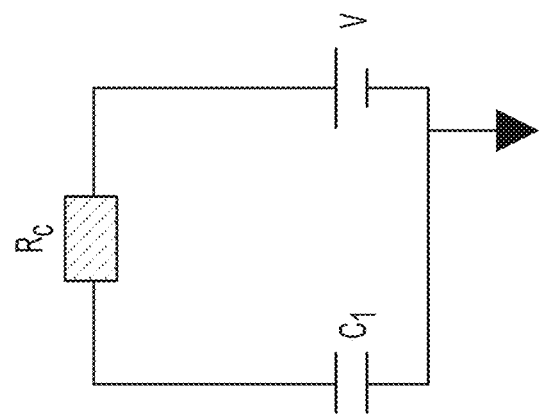
FIG. 8A is a schematic circuit diagram of the coil and gate configuration of the MEMS switch of FIG. 6 at time t=0.

In the configuration shown in FIG. 8A, the circuit 700 may operate the actuation component 131 as a gate electrode. That is, the actuation component 131 is coupled to the node between V and $R_C$ and thus receives a constant voltage. The actuation component 131 thus produces an electric field that exerts an electrostatic force on the beam 109. Also, the capacitor $C_1$ is charged.

FIG. 8B illustrates the resulting circuit when the switches S1 and S2 of circuit 700 are switched to their respective second states. Here, the circuit comprises a resistor $R_1$, capacitor $C_1$, and inductor $L_1$ representing the actuation component 131. In this configuration, the capacitor $C_1$ discharges, providing a current through inductor $L_1$ that generates a magnetic field. In one embodiment, the circuit 700 remains in this configuration until the capacitor $C_1$ fully discharges. In another embodiment, the circuit moves the switches $S_1$, $S_2$ to the first configuration when the capacitor $C_1$ is only partially discharged. In one embodiment, the resistor $R_C$ has values between 10 k-100 MΩ, the capacitor has values between 1 n-100 μF, and the charge pump may apply a voltage between 30-150V.

The switching of the circuit 700 may be based on a timed schedule or charge buildup. In one embodiment, the circuit 700 has a duty cycle that causes the circuit 700 to alternate between the first and second switch positions of switches $S_1$, $S_2$. In a second embodiment, the circuit 700 may be configured to switch between the first and second modes after the capacitor $C_1$ fully charges and may be configured to switch back after the capacitor $C_1$ fully discharges. In another embodiment, the circuit 700 may be timed to switch when the capacitor $C_1$ fully charges and discharges.

In one embodiment, the circuit 131 operates in each configuration once and the capacitor $C_1$ may be configured to partially discharge before the switches $S_1$, $S_2$ move to the second positions. Alternatively, the capacitor $C_1$ and charge pump V may be replaced by a voltage source, such as a battery, electrical mains, or a Thevenin circuit.

In another embodiment, the circuit 700 switches between each configuration, and the capacitor $C_1$ fully charges and discharges during each switching cycle. The time between switching is application dependent and may range from 5 μs to years.

The charge pump V is a direct current voltage source regulated by a control system. Controls for the system may include manually connecting the circuit 700 or using a control system to regulate the circuit 700.

The circuit 700 may be implemented in any suitable manner. In some embodiments, the components of circuit 700 are formed on the substrate 111. In alternative embodiments, one or more of the components of circuit 700 are formed off-chip. Thus, various configurations are possible.

Although the embodiments above describe a single cantilevered beam 109, such as in a single pole single throw switch, an electromagnetically actuated switch may also be applied in other switch types, including but not limited to single pole double throw switches, and double pole single throw switches, among others. Additionally, although the embodiments above describe closing a switch with an electrostatic force and opening the switch with an electromagnetic force, it is also possible to close the switch with an electromagnetic force and open the switch with a repulsive electrostatic force.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A microelectromechanical systems (MEMS) switch, comprising:
    a cantilevered beam connected to an anchor and spaced from an underlying substrate, the beam extending away from the anchor at least in a first direction;
    a gate electrode disposed on the substrate and underlying the beam; and
    a coil underlying the beam and having a center being offset, along the first direction, relative to the anchor, wherein the coil surrounds the gate electrode.

2. The MEMS switch of claim 1, further comprising a first source configured to drive the coil to produce a magnetic field and a second source configured to drive the gate electrode.

3. The MEMS switch of claim 1, wherein the coil is formed of a conducting material with conductivity greater than 10,000 S/m.

4. A microelectromechanical systems (MEMS) switch, comprising:
    a cantilevered beam connected to an anchor and spaced from an underlying substrate, the beam extending away from the anchor at least in a first direction;
    a gate electrode disposed on the substrate and underlying the beam; and
    a coil underlying the beam and having a center being offset, along the first direction, relative to the anchor, wherein the coil is next to the gate electrode on the substrate.

5. The MEMS switch of claim 4, further comprising a first source configured to drive the coil to produce a magnetic field and a second source configured to drive the gate electrode.

6. The MEMS switch of claim 4, wherein the coil is formed of a conducting material with conductivity greater than 10,000 S/m.

7. A microelectromechanical systems (MEMS) switch, comprising:
    a cantilevered beam connected to an anchor and spaced from an underlying substrate, the beam extending away from the anchor at least in a first direction;
    a gate electrode disposed on the substrate and underlying the beam; and
    a coil underlying the beam and having a center being offset, along the first direction, relative to the anchor, wherein the coil is a multi-layer coil including conductive traces positioned at multiple levels of the substrate.

8. The MEMS switch of claim 7, further comprising a first source configured to drive the coil to produce a magnetic field and a second source configured to drive the gate electrode.

9. The MEMS switch of claim 7, wherein the coil is formed of a conducting material with conductivity greater than 10,000 S/m.

10. A method of controlling a MEMS switch, comprising:
    electrostatically attracting a microfabricated, cantilevered beam toward an underlying electrical contact using a gate electrode underlying the microfabricated, cantilevered beam; and
    magnetically repulsing the microfabricated, cantilevered beam from the underlying electrical contact by inducing a current in the beam by generating a first magnetic field with a coil positioned under the beam.

11. The method of claim 10, further comprising alternately driving the coil and the gate electrode.

12. The method of claim 10, further comprising conductively coupling a radio frequency signal to the microfabricated, cantilevered beam.

13. The method of claim 10, wherein using the gate electrode and generating the first magnetic field with the coil comprise using a same coil-shaped structure electrically coupled in different configurations.

14. The method of claim 13, wherein generating a first magnetic field with the coil comprises discharging a capacitor through the coil.

15. The method of claim 14, further comprising charging the capacitor while using the gate electrode.

16. A microelectromechanical systems (MEMS) switch, comprising:
    a substrate;
    a beam mounted to the substrate by an anchor, the beam extending away from the anchor at least in a first direction;
    a gate electrode disposed on the substrate and underlying the beam; and
    a coil disposed on the substrate and underlying the beam, the coil having a center being offset, along the first direction, relative to the anchor, wherein the coil surrounds the gate electrode.

17. The MEMS switch of claim 15, further comprising a first source configured to drive the coil to produce a magnetic field and a second source configured to drive the gate electrode.

18. The MEMS switch of claim 15, wherein the coil is formed of a conducting material with conductivity greater than 10,000 S/m.

19. A microelectromechanical systems (MEMS) switch, comprising:
    a substrate;
    a beam mounted to the substrate by an anchor, the beam extending away from the anchor at least in a first direction;
    a gate electrode disposed on the substrate and underlying the beam; and
    a coil disposed on the substrate and underlying the beam, the coil having a center being offset, along the first direction, relative to the anchor, wherein the coil is next to the gate electrode on the substrate.

20. A microelectromechanical systems (MEMS) switch, comprising:
    a substrate;
    a beam mounted to the substrate by an anchor, the beam extending away from the anchor at least in a first direction;
    a gate electrode disposed on the substrate and underlying the beam; and
    a coil disposed on the substrate and underlying the beam, the coil having a center being offset, along the first direction, relative to the anchor, wherein the coil is a multi-layer coil including conductive traces positioned at multiple levels of the substrate.

* * * * *